United States Patent
Wang et al.

(10) Patent No.: US 10,218,373 B1
(45) Date of Patent: Feb. 26, 2019

(54) ANALOG-TO-DIGITAL CONVERTER CALIBRATION SYSTEM

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Shih-Chun Lo, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/990,836

(22) Filed: May 29, 2018

(30) Foreign Application Priority Data

Jan. 19, 2018 (CN) .......................... 2018 1 0052977

(51) Int. Cl.
*H03M 1/06* (2006.01)
*H03M 1/12* (2006.01)
*H03M 1/10* (2006.01)

(52) U.S. Cl.
CPC ....... *H03M 1/1023* (2013.01); *H03M 1/1071* (2013.01); *H03M 1/0607* (2013.01); *H03M 1/1009* (2013.01); *H03M 1/1215* (2013.01)

(58) Field of Classification Search
CPC .. H03M 1/1023; H03M 1/1071; H03M 1/121; H03M 1/123; H03M 1/1009; H03M 1/1215; H03M 1/0607; H03M 1/0624; H03M 1/10
USPC .......................................... 341/118, 120, 155
See application file for complete search history.

(56) References Cited

U.S. PATENT DOCUMENTS

| | | | |
|---|---|---|---|
| 7,961,123 B2 * | 6/2011 | Nagarajan ........... | H03M 1/1057 341/118 |
| 9,294,112 B1 * | 3/2016 | Devarajan ............. | H03M 1/121 |
| 9,793,910 B1 * | 10/2017 | Devarajan ........... | H03M 1/0634 |
| 2016/0079994 A1 | 3/2016 | Lee et al. | |

* cited by examiner

*Primary Examiner* — Khai M Nguyen
(74) *Attorney, Agent, or Firm* — CKC & Partners Co., Ltd.

(57) ABSTRACT

An ADC calibration system includes a clock generating circuit, under test ADCs, a standard ADC, and a calibration circuit. The clock generating circuit generates operation clocks according to a system clock, and generates a calibration clock according to the system clock and a selection signal. The under test ADCs sample an input signal according to the operation clocks to output under test sampling results. The standard ADC samples the input signal according to the calibration clock to output a standard sampling result. The calibration circuit makes the phases of the calibration clock and a first operation clock received by a first ADC to be the same. The calibration circuit compares the standard sampling result with a first under test sampling result to generate calibration information corresponding to the first under test sampling result, and calibrates the first under test sampling result according to the calibration information.

12 Claims, 8 Drawing Sheets

ANALOG-TO-DIGITAL CONVERTER CALIBRATION SYSTEM

CROSS-REFERENCE TO RELATED APPLICATION

This application claims priority to Chinese Application Serial Number 201810052977.6, filed Jan. 19, 2018, which is herein incorporated by reference in its entirety.

BACKGROUND

Field of Invention

The present invention relates to an ADC calibration system. More particularly, the present invention relates to an ADC calibration system can automatically perform output calibration.

Description of Related Art

A sampling circuit is used to transform the analog continuous signal into the digital discrete signal, and is indispensable to modern electronic products. To increase the sampling rate regarding to the analog signal, the traditional sampling circuit usually uses multiple analog-to-digital converters (ADCs) to sequentially sample the analog signal.

However, due to various factors of the production process, the multiple ADCs of the traditional sampling circuit may have different output characteristics. Please refer to FIG. 1(a), for example, if two output signals of two ADCs have different offset errors, the magnitude of the two output signals will have a fixed difference value. In yet another example, please refer to FIG. 1(b), if the two output signals of the two ADCs have different gain errors, the ratio of the magnitude of the two output signals will be X to 1, wherein X is a positive number greater or smaller than 1. In addition, please refer to FIG. 1(c), if the two output signals of the two ADCs have different time skew errors, the phases of the two output signals will be different.

As a result, because of the different output characteristics of the multiple ADCs, the digital signal generated by the traditional sampling circuit by sampling the analog signal will suffer from serious signal distortion. Therefore, lots of the information carried by the analog signal will be lost after the signal transformation process.

SUMMARY

The disclosure provides an ADC calibration system. The ADC calibration system comprises a clock generating circuit, multiple under test ADCs, a standard ADC, and a calibration circuit. The clock generating circuit is configured to generate multiple operation clocks according to a system clock, and generate a calibration clock according to the system clock and a selection signal. The multiple under test ADCs are configured to correspondingly sample an input signal according to the multiple operation clocks to output multiple under test sampling results. The standard ADC is configured to sample the input signal according to the calibration clock to output a standard sampling result. The calibration circuit is configured to control a phase of the calibration clock through the selection signal to make the phase of the calibration clock to be the same as a phase of a first operation clock received by a first ADC of the multiple under test ADCs. The calibration circuit compares the standard sampling result with a first under test sampling result generated by the first ADC to generate calibration information corresponding to the first under test sampling result, and calibrates the first under test sampling result according to the calibration information to make the calibrated first under test sampling result approach to the standard sampling result.

The disclosure provides another ADC calibration system. The ADC calibration system comprises a clock generating circuit, an under test ADC, a standard ADC, and a calibration circuit. The clock generating circuit is configured to generate an operation clock and a calibration clock according to a system clock, wherein a phase of the operation clock is the same as a phase of the calibration clock. The under test ADC is configured to sample an input signal according to the operation clock to output an under test sampling result. The standard ADC is configured to sample the input signal according to the calibration clock to output a standard sampling result. The calibration circuit is configured to compare the standard sampling result with the under test sampling result to generate a calibration information corresponding to the under test sampling result, and calibrate the under test sampling result according to the calibration information to make the calibrated under test sampling result approach to the standard sampling result.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
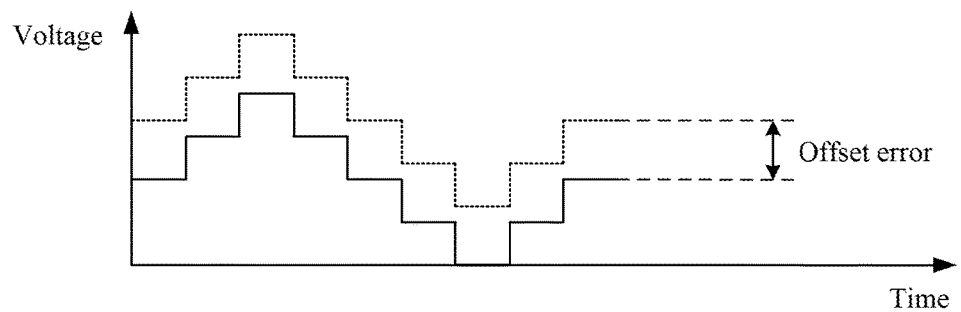
FIGS. 1(a)~1(c) are timing diagrams for illustrating the output waveforms of different ADCs of the traditional sampling circuit.
Figure 1B:
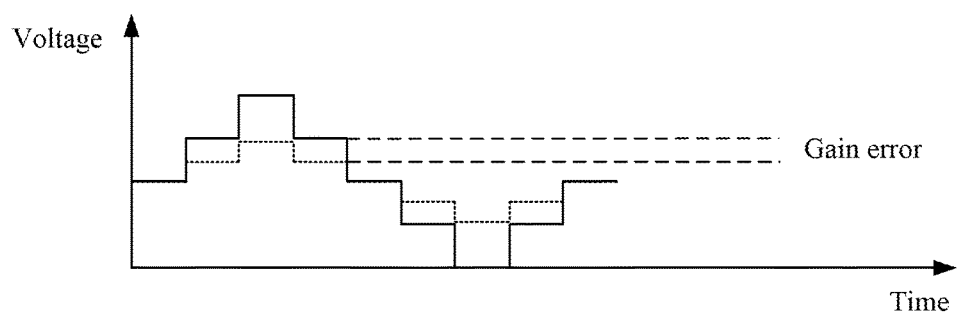
Figure 1C:
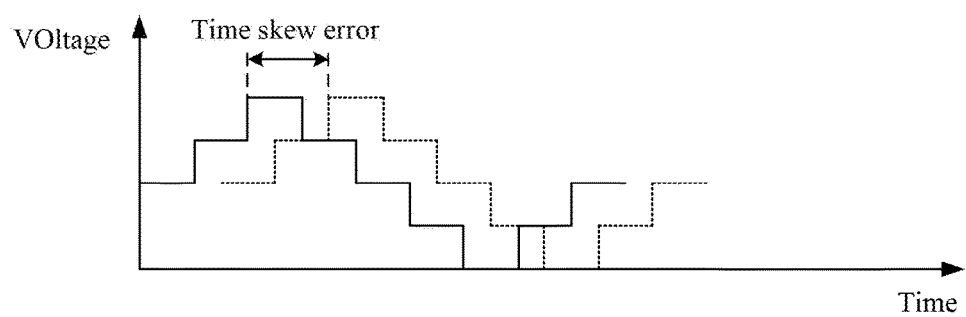

Reference will now be made in detail to the present embodiments of the invention, examples of which are illustrated in the accompanying drawings. Wherever possible, the same reference numbers are used in the drawings and the description to refer to the same or like parts.

Figure 2:
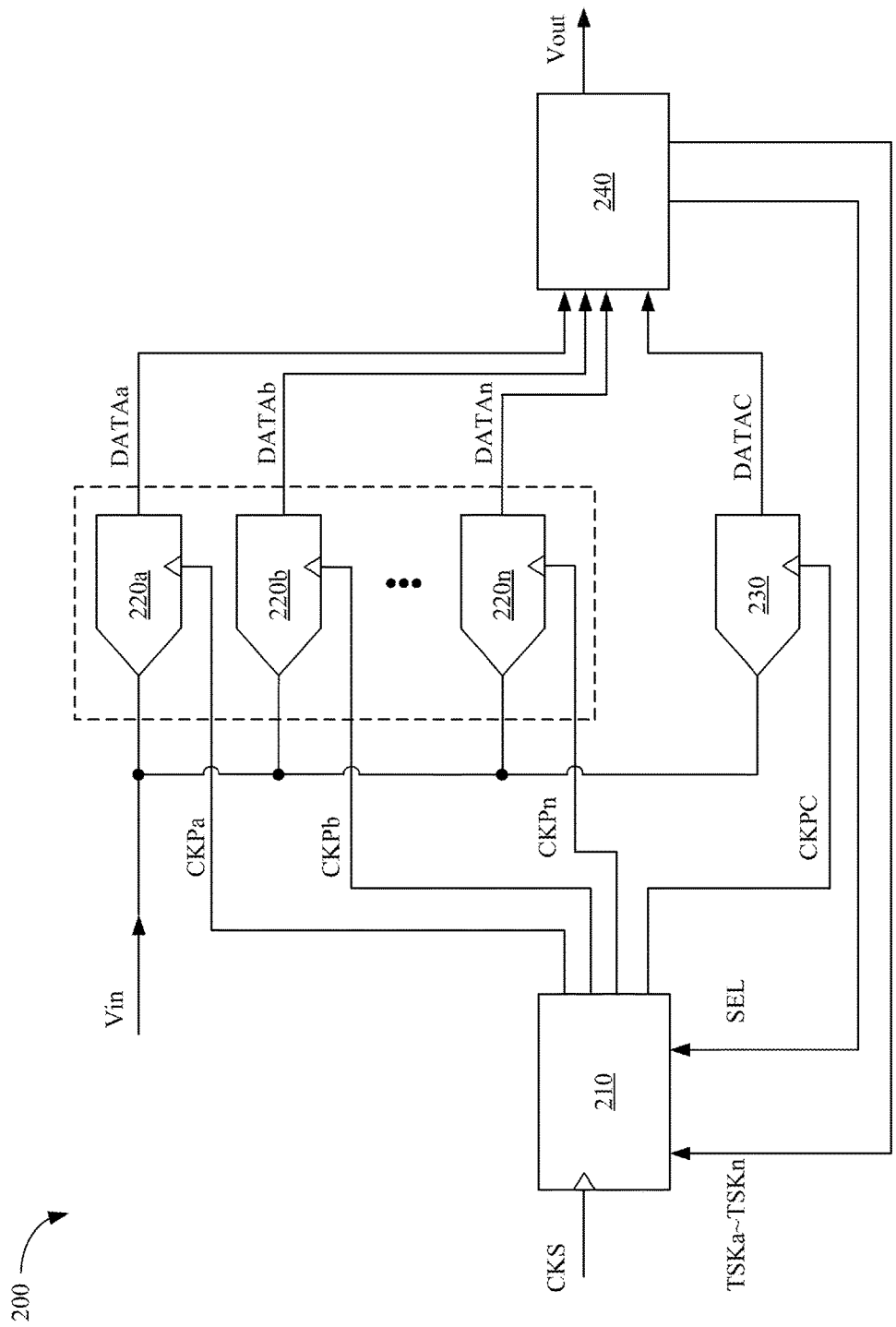
FIG. 2 is a simplified functional block diagram of an ADC calibration system according to an embodiment of this disclosure.

FIG. 2 is a simplified functional block diagram of an analog-to-digital converter (ADC) calibration system 200 according to an embodiment of this disclosure. The ADC calibration system 200 comprises a clock generating circuit 210, multiple under test ADCs 220a~220n, a standard ADC 230, and a calibration circuit 240. The ADC calibration system 200 is configured to sample an input signal Vin to output an output signal Vout, wherein the input signal Vin is an analog signal and the output signal Vout is an digital signal. For the sake of brevity, other functional blocks of the ADC calibration system 200 are not shown in FIG. 2.

Throughout the specification and drawings, indexes a~n may be used in the reference numbers of components and signals for ease of referring to respective components and signals. The use of indexes a~n does not intend to restrict the amount of components and signals to any specific number.

The clock generating circuit 210 is configured to generate multiple operation clocks CKPa~CKPn according to a system clock CKS, wherein the frequency of the system clock CKS is higher than the frequencies of the multiple operation clocks CKPa~CKPn. The clock generating circuit 210 is further configured to generate a calibration clock CKPC according to the system clock CKS and a selection signal SEL, wherein the frequency of the calibration clock CKPC is the same as the frequency of each of the multiple operation clocks CKPa~CKPn.

The under test ADCs 220a~220n are configured to correspondingly receive the operation clocks CKPa~CKPn from the clock generating circuit 210. For example, the under test ADC 220a may receive the operation clock CKPa, the under test ADC 220b may receive the operation clock CKPb, and so on. The under test ADCs 220a~220n is further configured to periodically sample the input signal Vin according to the operation clocks CKPa~CKPn, and periodically and sequentially generate multiple under test sampling results DATAa~DATAn.

That is, through the collaborative operations of the under test ADCs 220a~220n, the analog signal (e.g., the input signal Vin) can be transformed into various digital signals (e.g., the under test sampling results DATAa~DATAn). However, as aforementioned, the output characteristic of each under test ADCs 220a~220n may be different for that of the others (i.e., each of the under test ADCs 220a~220n may have an offset error, a gain error, and/or a time skew error different from that of the others). Therefore, if the under test sampling results DATAa~DATAn are outputted directly without being calibrated, lots of information carried by the input signal Vin may be lost.

Figure 3:
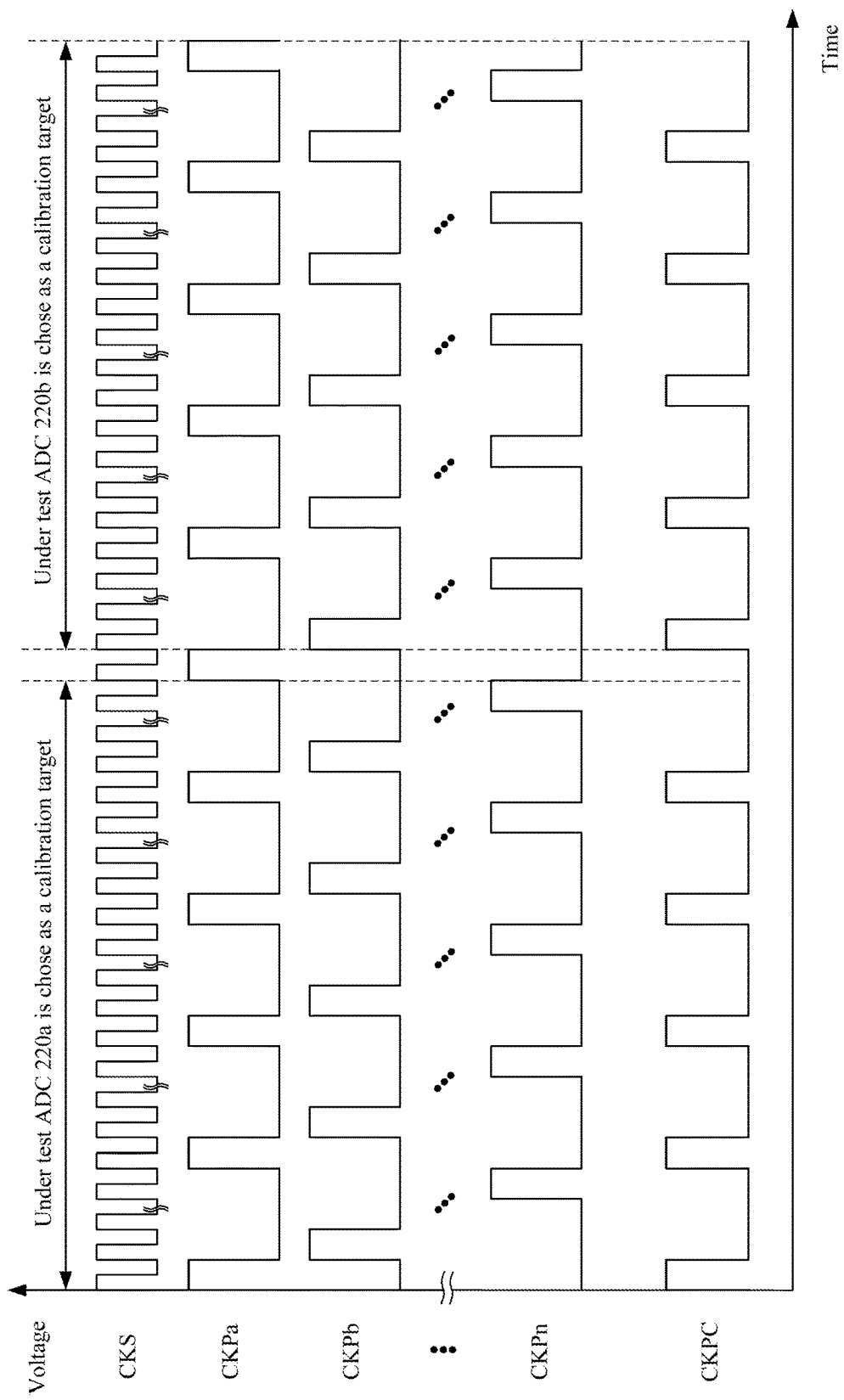
FIG. 3 is a timing diagram for illustrating operations of the ADC calibration system of FIG. 2 during the calibration period according to an embodiment of this disclosure.

To prevent the information loss, the operations of the ADC calibration system 200 include a calibration period and a normal period. FIG. 3 is a timing diagram for illustrating operations of the ADC calibration system of FIG. 2 during the calibration period according to an embodiment of this disclosure. During the calibration period, the calibration circuit 240 may choose the under test ADC 220a as a calibration target, and control the clock generating circuit 210 to configure the phase of the calibration clock CKPC to be the same as the phase of the operation clock CKPa through the selection signal SEL. The standard ADC 230 samples the input signal Vin according to the calibration clock CKPC to generate the standard sampling result DATAC. Therefore, in the situation that the phases of the calibration clock CKPC and the operation clock CKPa are the same, the standard sampling result DATAC generated by the standard ADC 230 will be corresponding to the under test sampling result DATAa generated by the under test ADC 220a.

Then, the calibration circuit 240 may compare the standard sampling results DATAC sequentially generated by the standard ADC 230 with the under test sampling results DATAa sequentially generated by the under test ADC 220a, respectively. For example, the calibration circuit 240 may compare five standard sampling results DATAC generated at different time spots with five under test sampling results DATAa generated at different time spots, respectively. The calibration circuit 240 may also calculates calibration information corresponding to the under test ADC 220a according to the comparison results, wherein the calibration information may include offset correction value, gain correction value, and time skew correction value.

That is, as shown in FIG. 3, when the calibration circuit 240 choose the under test ADC 220a as the calibration target, the phase of the calibration clock CKPC would be the same as the phase of the operation clock CKPa in multiple continuous periods (e.g., five continuous periods).

The calibration circuit 240 may calculate the calibration information corresponding to the under test ADCs 220b~220n by methods similar to the method used to calculate the calibration information corresponding to the under test ADC 220a, for the sake of brevity, those descriptions will not be repeated here.

When the ADC calibration system 200 finishes the calibration period and enters the normal period, the phase relationships between each of the operation clocks CKPa~CLPn remain the same as that of in the calibration period, and the calibration clock CKPC may maintain at a fixed voltage during the normal period. As a result, the under test ADCs 220a~220n may still sample the input signal Vin, and the calibration circuit 240 may use the calibration information obtained in the calibration period to calibrate the under test sampling results DATAa~DATAn. Then, the calibration circuit 240 may output the calibrated under test sampling results DATAa~DATAn as an output signal Vout.

In other words, the ADC calibration system 200 use the standard sampling result DATAC of the standard ADC 230 as a criterion to calibrate the under test sampling results DATAa~DATAc. Each of the calibrated under test sampling results DATAa~DATAc has an offset error, a gain error, and/or a time skew error the same as that of the standard sampling result DATAC. Therefore, according to the calibrated results, it is equivalent to the situation that the output characteristics of the under test ADCs 220a~220n are being calibrated to be the same as the output characteristic of the standard ADC 230, and thereby the signal distortion caused by the difference among the output characteristics of the under test ADCs 220a~220n may be prevented.

In some embodiments, when a first time of the calibration period is finished, the ADC calibration system 200 may conduct the operations of the calibration period for one or more additional times during the normal period. As a result, the calibration information corresponding to the under test ADCs 220a~220n can be updated in real time.

In other embodiments, when a first time of the calibration period is finished, the ADC calibration system 200 may store the calibration information corresponding to the under test ADCs 220a~220n in a memory module, and would no more conduct the operations of the calibration period.

Figure 4:
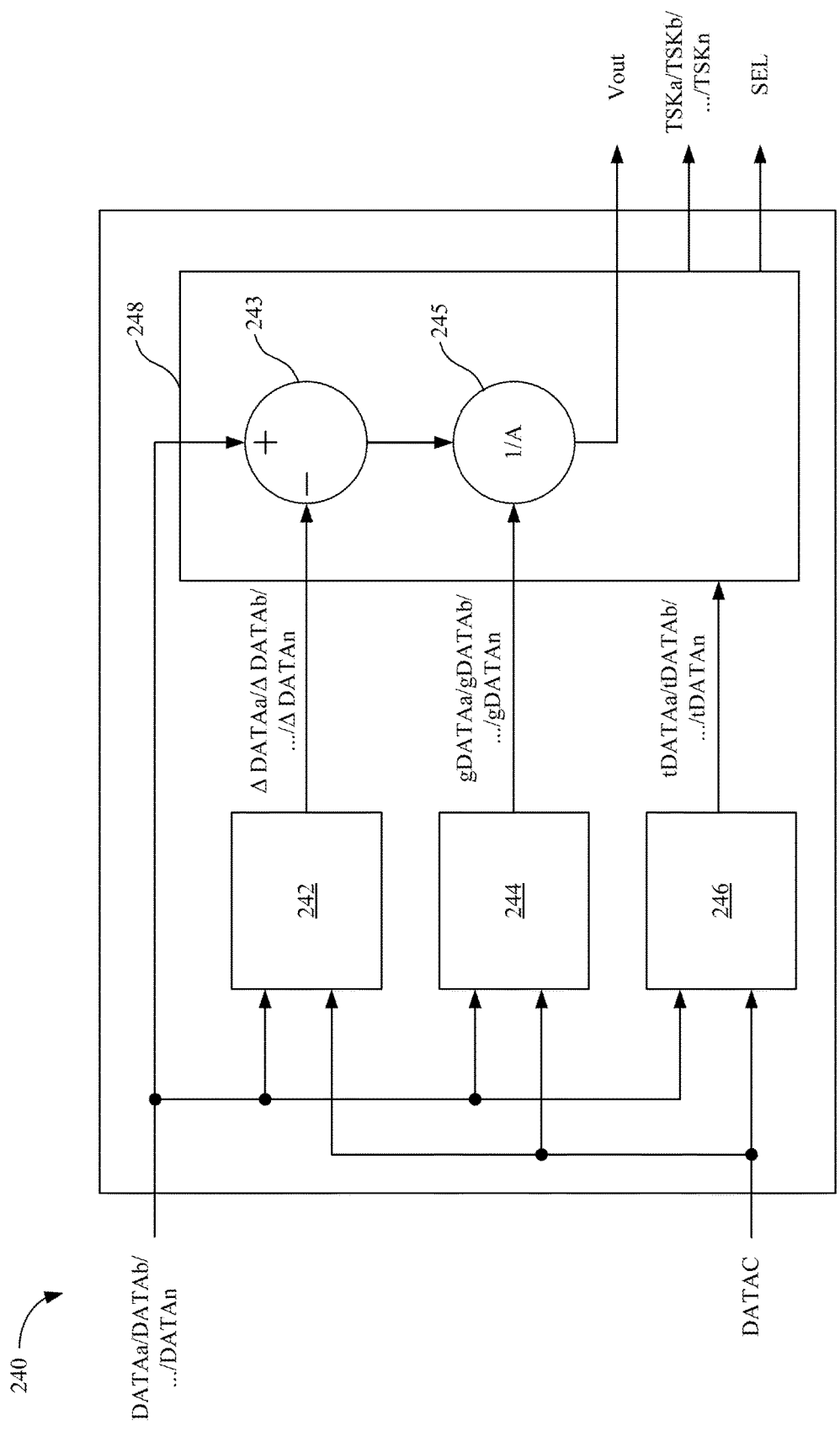
FIG. 4 is a simplified functional block diagram of the calibration circuit of FIG. 2 according to an embodiment of this disclosure.

FIG. 4 is a simplified functional block diagram of the calibration circuit 240 of FIG. 2 according to an embodiment of this disclosure. The calibration circuit 240 comprises an offset calculation circuit 242, a gain calculation circuit 244, a time skew calculation circuit 246, and a processing circuit 248, wherein the processing circuit 248 comprises an adder-subtractor circuit 243 and a multiplier circuit 245.

In the calibration period, when the calibration circuit 240 chooses the under test ADC 220a as the calibration target, the processing circuit 248 may use the selection signal SEL to control the clock generating circuit 210, and thereby the clock generating circuit 210 may configure the phase of the calibration clock CKPC to be the same as the phase of the operation clock CKPa. As a result, the offset calculation circuit 242 and gain calculation circuit 244 receive multiple pairs (e.g., five pairs) of corresponding standard sampling result DATAC and under test sampling result DATAa, wherein the multiple pairs of the standard sampling result DATAC and under test sampling result DATAa are sequentially generated.

The offset calculation circuit 242 may use multiple methods to calculate the offset correction value ΔDATAa corresponding to the under test ADC 220a. For example, the offset calculation circuit 242 may calculate the difference between each pair of the standard sampling result DATAC and the under test sampling result DATAa to obtain multiple difference values, and average the multiple difference values to obtain an average value. Then, the offset calculation circuit 242 may calculate the offset correction value ΔDATAa corresponding to the under test ADC 220a based on the obtained average value.

The gain calculation circuit 244 may use multiple methods to calculate the gain correction value gDATAa corresponding to the under test ADC 220a. For example, the gain calculation circuit 244 may calculate the difference between each pair of the standard sampling result DATAC and the under test sampling result DATAa to obtain the multiple difference values, obtain multiple absolute values of the multiple difference values, and average the multiple absolute values to obtain an average value of the multiple absolute values. Then, the gain calculation circuit 244 may calculate the gain correction value gDATAa corresponding to the under test ADC 220a based on the obtained average value of the multiple absolute values.

The offset calculation circuit 242 and gain calculation circuit 244 may calculate offset correction values ΔDATAb~ΔDATAn and gain correction value gDATAb~gDATAn of the under test ADC 220b~220n by methods similar to the methods used to calculate the offset correction value ΔDATAa and the gain correction value gDATAa of the under test ADC 220a, for the sake of brevity, those descriptions will not be repeated here.

In other words, the offset calculation circuit 242 may obtain the difference values between the standard sampling result DATAC and one of the under test sampling results DATAa~DATAn corresponding to multiple different time spots, and obtain the average value based on the obtained difference values. Then, the offset calculation circuit 242 may calculate the offset correction value corresponding to one of the under test ADCs 220a~220n. The gain calculation circuit 244 may obtain the absolute values of the difference values between the standard sampling result DATAC and one of the under test sampling results DATAa~DATAn corresponding to multiple different time spots, and obtain the average value of the absolute values. Then the gain calculation circuit 244 may calculate the gain correction value corresponding to one of the under test ADCs 220a~220n.

In the normal period, the adder-subtractor circuit 243 of the processing circuit 248 may use the offset correction values ΔDATAb~ΔDATAn to correspondingly apply an offset calibration to each of the received under test sampling results DATAa~DATAn. The multiplier circuit 245 may receive the under test sampling results DATAa~DATAn being calibrated by the adder-subtractor circuit 243, and use the gain correction values gDATAa~gDATAn to apply an gain calibration to each of the received under test sampling results DATAa~DATAn. Then, the processing circuit 248 may output the under test sampling results DATAa~DATAn, which have been applied the offset calibration and gain calibration, as the output signal Vout.

In addition, in the calibration period, when the calibration circuit 240 chooses the under test ADC 220a as a calibration target, the time skew calculation circuit 246 receives multiple pairs (e.g., five pairs) of corresponding standard sampling result DATAC and under test sampling result DATAa, wherein the multiple pairs are sequentially generated. The time skew calculation circuit 246 may calculate a time skew correction value tDATAa corresponding to the under test sampling result DATAa based on the received standard sampling result DATAC and under test sampling result DATAa.

The time skew calculation circuit 246 may use similar methods to calculate the time skew correction values tDATAb~tDATAn corresponding to the under test ADCs 220b~220n, for the sake of brevity, those descriptions will not be repeated here.

In the normal period, the processing circuit 248 may output multiple time skew calibration signals TSKa~TSKn to the clock generating circuit 210 according to the multiple time skew correction values tDATAa~tDATAn corresponding to the under test ADCs 220a~220n. As a result, the clock generating circuit 210 adjusts the phases of the operation clocks CKPa~CKPn, and thereby the time skew errors of the under test sampling results DATAa~DATAn and the time skew error of the standard sampling result DATAC are calibrated to be the same.

Figure 5:
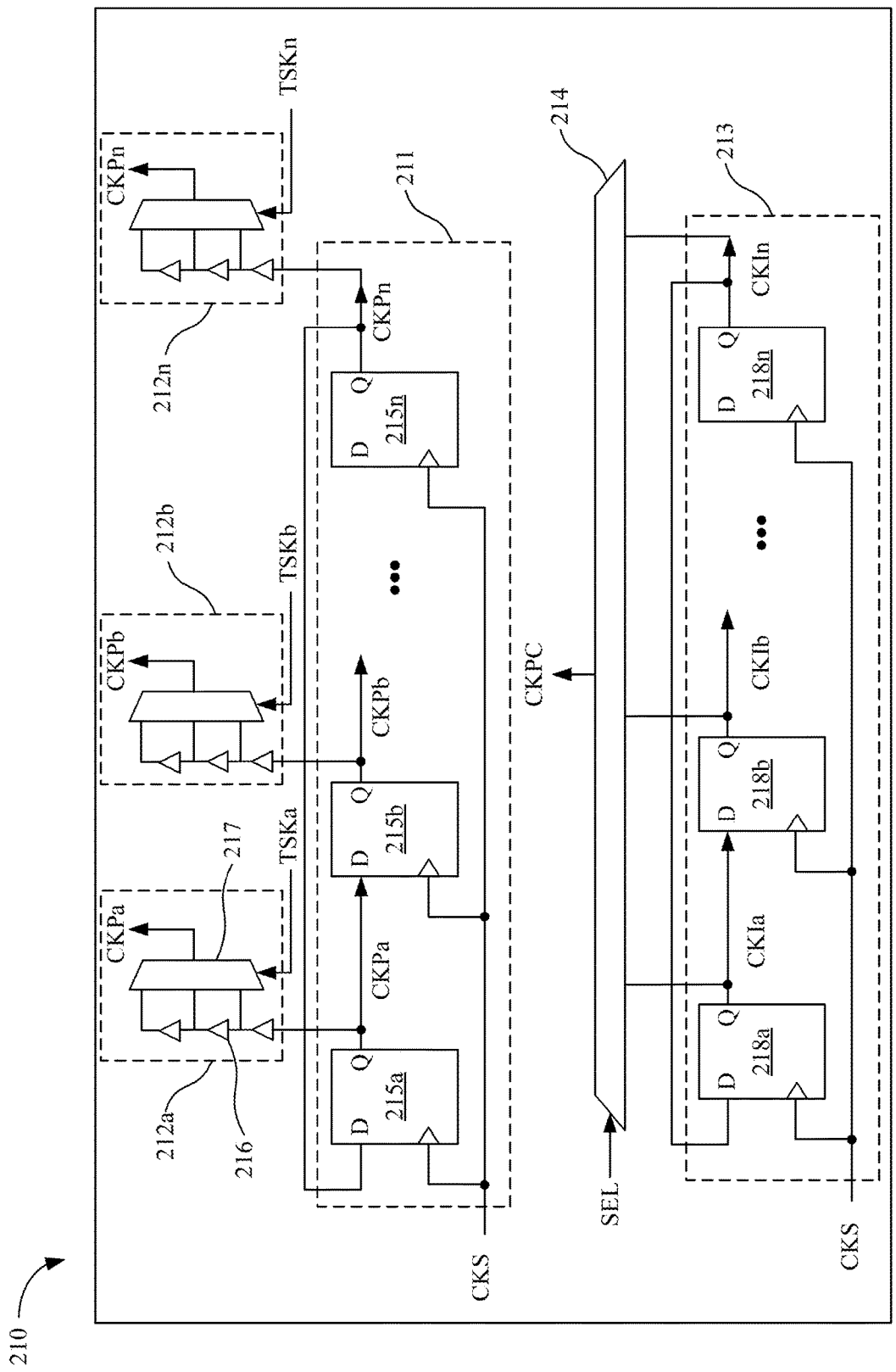
FIG. 5 is a simplified functional block diagram of the clock generating circuit of FIG. 2 according to an embodiment of this disclosure.

FIG. 5 is a simplified functional block diagram of the clock generating circuit 210 of FIG. 2 according to an embodiment of this disclosure. The clock generating circuit 210 comprises an operation flip-flop group 211, multiple phase-adjusting units 212a~212n, a standard flip-flop group 213, and a standard multiplexer 214. The phase-adjusting units 212a~212n couple with the operation flip-flop group 211, and the multiple input nodes of the standard multiplexer 214 couple with the standard flip-flop group 213.

The operation flip-flop group 211 comprises multiple flip-flops 215a~215n sequentially coupled in a series connection, and configured to generate operation clocks CKPa~CKPn according to the system clock CKS. For example, the input node of the flip-flop 215a couples with the positive output node of the flip-flop 215n, the positive output node of the flip-flop 215a couples with the input node of the flip-flop 215b, and the flip-flop 215a outputs the operation clock CKPa by the positive output node of the flip-flop 215a according to the system clock CKS. In yet another example, the positive output node of the flip-flop 215b couples with the input node of the flip-flop 215c (not shown in FIG. 5), and the flip-flop 215b outputs the operation clock CKPb by the positive output node of the flip-flop 215b according to the system clock CKS, and so on.

The phase-adjusting units 212a~212n correspondingly couples with the positive output nodes of the flip-flops 215a~215n, and is configured to adjust the phases of the operation clocks CKPa~CKPn, respectively, according to the time skew calibration signals TSKa~TSKn. Each of the phase-adjusting units 212a~212n comprises multiple buffers 216 and a phase-adjusting multiplexer 217, wherein the multiple buffers 216 are sequentially coupled in a series connection, and the output node of each buffers 216 couples with one of the input nodes of the phase-adjusting multiplexer 217. The phase-adjusting multiplexer 217 is configured to selectively output an operation clock delayed by the one or more buffers 216 according to the received time skew calibration signals.

For example, the phase-adjusting units 212a couples with the positive output node of the flip-flop 215a, and use the series connected buffers 216 to receive the operation clock CKPa. As a result, the phase-adjusting units 212a may generate multiple operation clocks CKPa having different levels of delay, respectively. The phase-adjusting multiplexer 217 of the phase-adjusting units 212a may, according to the received time skew calibration signal TSKa, selectively output one of the multiple operation clocks CKPa delayed by the one or more of the buffers 216 to the under test ADC 220a.

In yet another example, the phase-adjusting units 212b couples with the positive output node of the flip-flop 215b, and use the series connected buffers 216 to receive the operation clock CKPb. As a result, the phase-adjusting units 212b may generate multiple operation clocks CKPb having different levels of delay, respectively. The phase-adjusting multiplexer 217 of the phase-adjusting units 212b may, according to the received time skew calibration signal TSKb, selectively output one of the multiple operation clocks CKPb delayed by the one or more of the buffers 216 to the under test ADC 220b, and so on.

The standard flip-flop group 213 comprises multiple flip-flops 218a~218n couples in a series connection, and is configured to generate multiple standard clocks CKIa~CKIn according to the system clock CKS. For example, the input node of the flip-flop 218a couples with the positive output node of the flip-flop 218n, the positive output node of the flip-flop 218a couples with the input node of the flip-flop 218b, and the flip-flop 218a outputs the standard clock CKIa by the positive output node of the flip-flop 218a according to the system clock CKS. In yet another example, the positive output node of the flip-flop 218b couples with the input node of the flip-flop 218c (not shown in FIG. 5), and the flip-flop 218b outputs the standard clock CKIb by the positive output node of the flip-flop 218b according to the system clock CKS, and so on.

The standard multiplexer 214 is configured to output the calibration clock CKPC. Moreover, the standard multiplexer 214 may, according to the selection signal SEL generated by the calibration circuit 240, adjust the phase of the calibration clock CKPC to be the same as a phase of one of the standard clocks CKIa~CKIn.

For example, when the calibration circuit 240 chooses the under test ADC 220a as the calibration target, the standard multiplexer 214 may, according to the selection signal SEL, adjust the phase of the calibration clock CKPC to be the same as the phase of the standard clock CKIa. In this situation, the phase of the calibration clock CKPC would be the same as the phase of the operation clock CKPa outputted by the phase-adjusting multiplexer 217.

In yet another example, when the calibration circuit 240 chooses the under test ADC 220b as the calibration target, the standard multiplexer 214 may, according to the selection signal SEL, adjust the phase of the calibration clock CKPC to be the same as the phase of the standard clock CKIb. In this situation, the phase of the calibration clock CKPC would be the same as the phase of the operation clock CKPb outputted by the phase-adjusting multiplexer 217.

Figure 6:
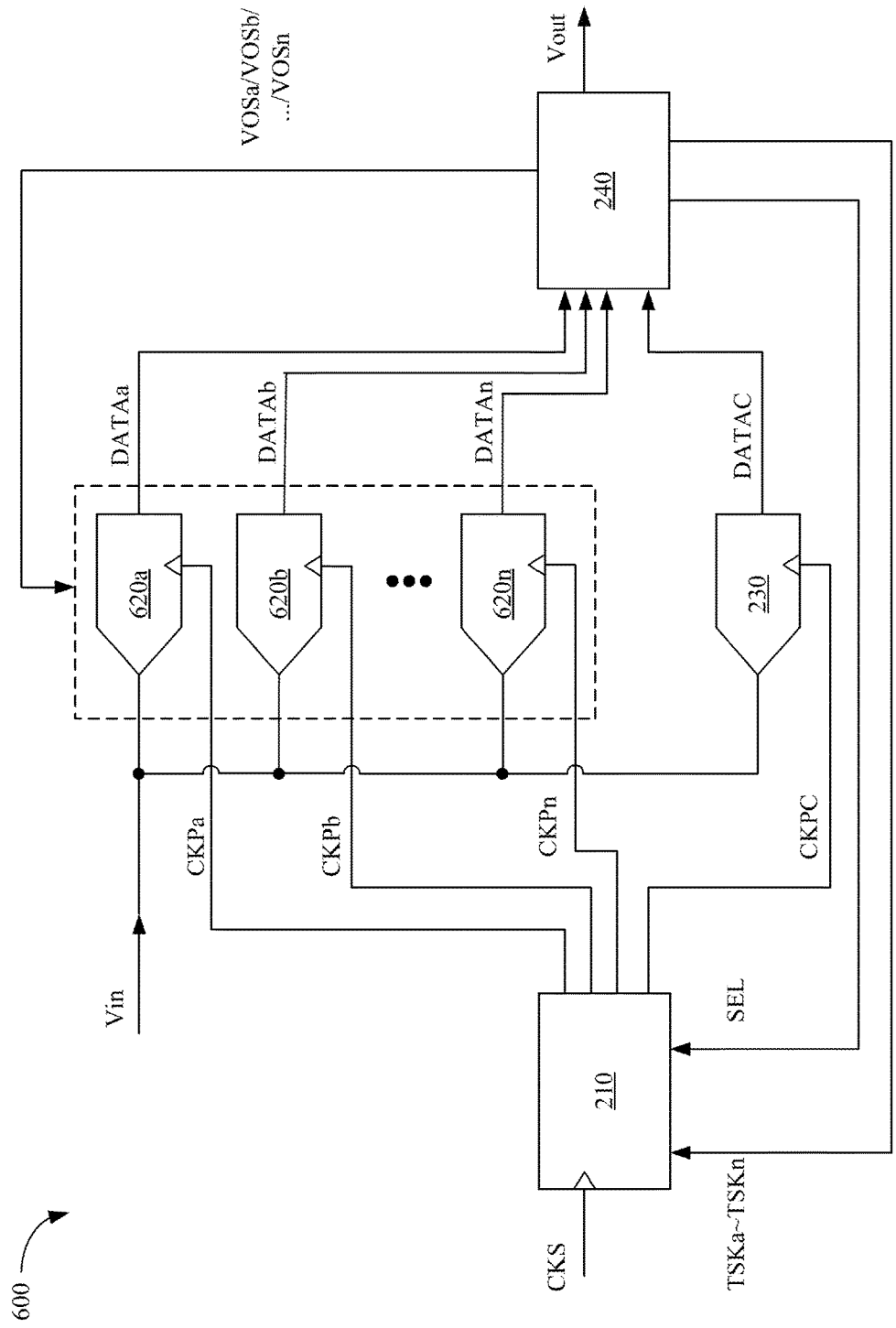
FIG. 6 is a simplified functional block diagram of an ADC calibration system according to another embodiment of this disclosure.

FIG. 6 is a simplified functional block diagram of an ADC calibration system 600 according to another embodiment of this disclosure. The ADC calibration system 600 is similar to the ADC calibration system 200, the difference is that the offset calibrations of the ADC calibration system 600 are conducted by the under test ADCs 620a~620n, rather than being conducted by the calibration circuit 240. The calibration circuit 240 may output multiple offset calibration signals VOSa~VOSn according to multiple offset correction values ΔDATAa~ΔDATAn corresponding to the under test ADCs 620a~620n. The under test ADCs 620a~620n may conduct offset calibrations according to the received offset calibration signals VOSa~VOSn. For the sake of brevity, other functional blocks of the ADC calibration system 600 are not shown in FIG. 6.

Figure 7:
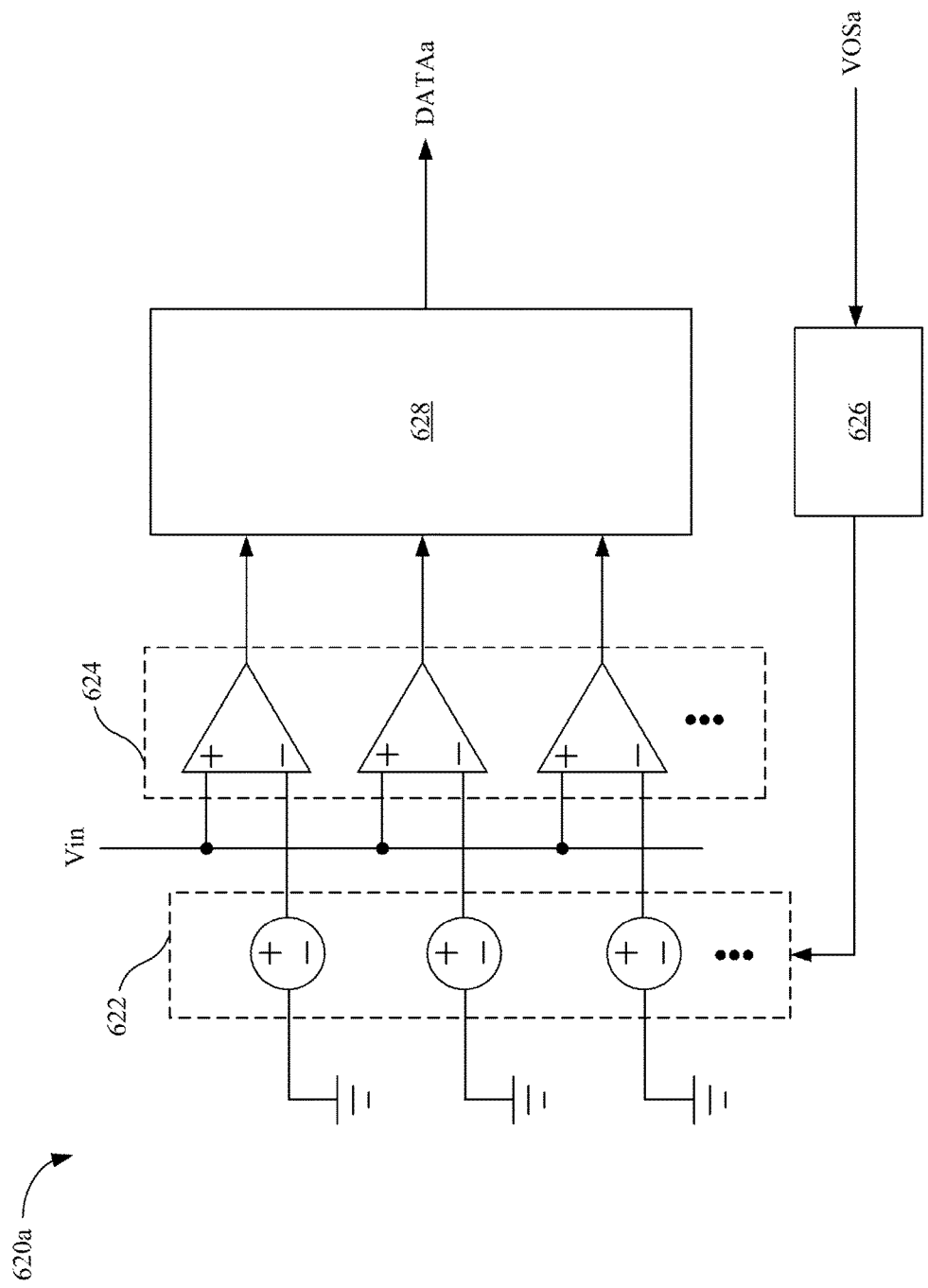
FIG. 7 is a simplified functional block diagram of the under test ADC of FIG. 6 according to an embodiment of this disclosure.

Please refer to FIG. 7, take the under test ADC 620a as an example, the under test ADC 620a comprises a reference voltage group 622, a comparator group 624, a voltage adjusting circuit 626, and an encoding circuit 628. Multiple comparators of the comparator group 624 are configured to compare the input signal Vin with multiple reference voltages, wherein the multiple reference voltages are generated by multiple voltage sources of the reference voltage group 622. The comparator group 624 may output the comparison results to the encoding circuit 628, and the encoding circuit 628 may generate the under test sampling result DATAa according the received comparison results.

The voltage adjusting circuit 626 may, according to the offset calibration signal VOSa, adjust the voltage levels of the one or more reference voltages generated by the reference voltage group 622, so as to calibrate the offset error of the under test sampling result DATAa. For example, in the situation that the offset error of the under test sampling result DATAa is greater than the offset error of the standard sampling result DATAC, the voltage adjusting circuit 626 may raise the one or more reference voltages of the reference voltage group 622. On contrary, in the situation that the offset error of the under test sampling result DATAa is smaller than the offset error of the standard sampling result DATAC, the voltage adjusting circuit 626 may lower the one or more reference voltages of the reference voltage group 622.

The foregoing descriptions regarding the implementations, connections, operations, and related advantages of the ADC calibration system 200 are also applicable to the ADC calibration system 600. For the sake of brevity, those descriptions will not be repeated here.

As can be appreciated form the foregoing embodiments, the ADC calibration systems 200 and 600 use the standard sampling result DATAC as a criterion to automatically calibrate the under test sampling results DATAa DATAn, and output the calibrated under test sampling results DATAa DATAn. Therefore, according to the output signal Vout, it is equivalent to the situation that the ADC calibration systems 200 and 600 adjust the output characteristics of the under test ADCs 220a~220n and 620a~620n to be the same as that of the standard ADC 230. Therefore, the signal distortion caused by the differences among the output characteristics of the under test ADCs 220a~220n and 620a~620n can be prevented.

As a result, the ADC calibration system 200 and 600 can perfectively transform the analog information carried by the input signal Vin into digital information, and output the digital information as the output signal Vout without facing the information loss problem.

Figure 8:
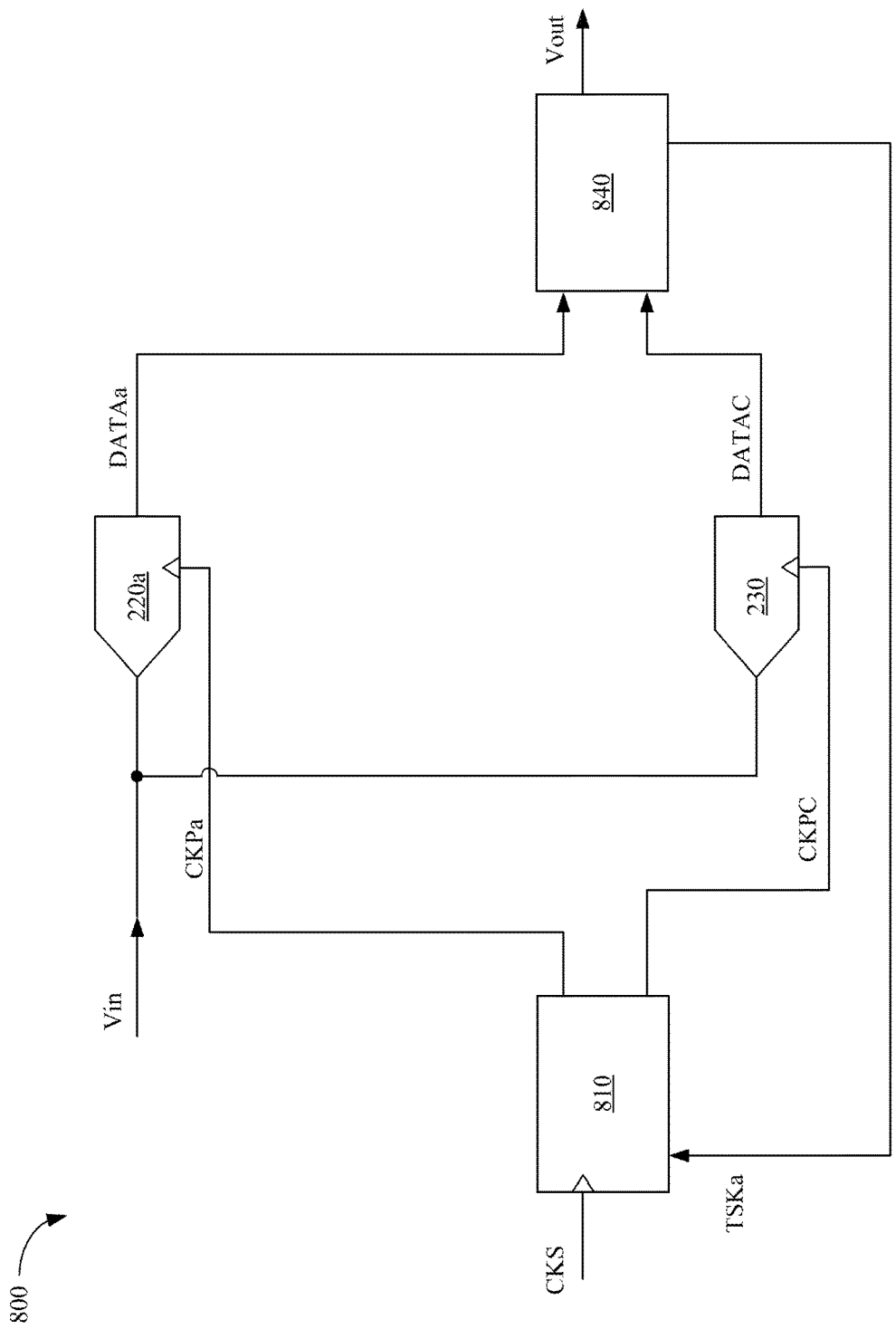
FIG. 8 is a simplified functional block diagram of an ADC calibration system according to yet another embodiment of this disclosure.

FIG. 8 is a simplified functional block diagram of an ADC calibration system 800 according to yet another embodiment of this disclosure. The ADC calibration system 800 is similar to the ADC calibration system 200, the difference is that the ADC calibration system 800 comprises only one under test ADC 220a, and does not comprise other under test ADCs. Therefore, the calibration circuit 840 of the ADC calibration system 800 has no need to output the selection signal SEL to the clock generating circuit 810. For the sake of brevity, other functional blocks of the ADC calibration system 800 are not shown in FIG. 8.

The clock generating circuit 810 outputs the operation clock CKPa and the calibration clock CKPC to the under test ADC 220a and the standard ADC 230, respectively, wherein the phase of the operation clock CKPa and the phase of the calibration clock CKPC are the same.

In some embodiments, the under test ADC 220a and the standard ADC 230 of the ADC calibration system 800 receive the same clock signal from the clock generating circuit 810.

Based on a method similar to the method used by the ADC calibration system 200, the ADC calibration system 800 may enable the standard ADC 230 for a plurality of times to generate or update the calibration information corresponding to the under test ADC 220a (e.g., the offset correction value ΔDATAa, gain correction value gDATAa, or time skew correction value tDATAa). In the situation that the ADC calibration system 800 has no need to generate or update the aforesaid calibration information, the ADC calibration system 800 may switch the standard ADC 230 form the enable status into the disable status to decelerate the degradation speed of the standard ADC 230.

As a result, even if the under test ADC 220a degrades because of a long operation time, the ADC calibration system 800 still can use the output of the un-degraded or merely un-degraded standard ADC 230 as the criterion to calibrate the under test sampling result DATAa of the under test ADC 220a. Then, the ADC calibration system 800 may output the calibrated under test sampling result DATAa as the output signal Vout.

In other words, the ADC calibration system 800 can remain the uniformity of the output signal Vout during the long operation time, so as to prevent the output signal Vout being affected by the degradation of the under test ADC 220a.

The foregoing descriptions regarding the implementations, connections, operations, and related advantages of the ADC calibration system 200 are also applicable to the ADC calibration system 800. For the sake of brevity, those descriptions will not be repeated here.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An ADC calibration system, comprising:
   a clock generating circuit, configured to generate multiple operation clocks according to a system clock, and generate a calibration clock according to the system clock and a selection signal;
   multiple under test ADCs, configured to correspondingly sample an input signal according to the multiple operation clocks to output multiple under test sampling results;
   a standard ADC, configured to sample the input signal according to the calibration clock to output a standard sampling result; and
   a calibration circuit, configured to control a phase of the calibration clock through the selection signal to make the phase of the calibration clock to be the same as a phase of a first operation clock received by a first ADC of the multiple under test ADCs;
   wherein the calibration circuit compares the standard sampling result with a first under test sampling result generated by the first ADC to generate calibration information corresponding to the first under test sampling result, and calibrates the first under test sampling result according to the calibration information to make the calibrated first under test sampling result approach to the standard sampling result.

2. The ADC calibration system of claim 1, wherein the calibration circuit is further configured to conduct the following operations:
   when the phase of the calibration clock is the same as the phase of the first operation clock, the calibration circuit compares the standard sampling result with the first under test sampling result; and
   when the phase of the calibration clock is similar to a phase of a second operation clock received by a second ADC of the multiple under test ADCs, the calibration circuit compares the standard sampling result with a second under test sampling result generated by the second ADC.

3. The ADC calibration system of claim 2, wherein when the calibration circuit has compared the standard sampling result with each of the multiple under test sampling results, the clock generating circuit stops outputting the calibration clock.

4. The ADC calibration system of claim 1, wherein the calibration information comprises an offset correction value and a gain correction value, and the calibration circuit comprises:
   an offset calculation circuit, configured to calculate an average value of multiple difference values between the standard sampling result and the first under test sampling result corresponding to multiple time points to generate the offset correction value; and
   a gain calculation circuit, configured to calculate an average value of absolute values of the multiple difference values between the standard sampling result and the first under test sampling result corresponding to the multiple time points to generate the gain correction value.

5. The ADC calibration system of claim 4, wherein the calibration circuit further comprises:
an adder-subtractor circuit, configured to apply an offset calibration to the first under test sampling result according to the offset correction value; and
a multiplier circuit, configured to receive the first under test sampling result outputted by the adder-subtractor circuit, and apply a gain calibration to the first under test sampling result outputted by the adder-subtractor circuit according to the gain correction value.

6. The ADC calibration system of claim 4, wherein the calibration circuit outputs the offset correction value to the first ADC, and the first ADC comprises:
a voltage adjusting circuit, configured to adjust a voltage level of a reference voltage according to the offset correction value to apply an offset calibration to the first under test sampling result.

7. The ADC calibration system of claim 6, wherein the calibration circuit further comprises:
a multiplier circuit, configured to receive the first under test sampling result, and apply a gain calibration to the first under test sampling result according to the gain correction value.

8. The ADC calibration system of claim 1, wherein the calibration information comprises a time skew correction value, and the calibration circuit comprises:
a time skew calculation circuit, configured to compare the first under test sampling result with the standard sampling result to calculate the time skew correction value;
wherein the calibration circuit outputs a time skew calibration signal to the clock generating circuit according to the time skew correction value to control the clock generating circuit to calibrate the phase of the first operation clock.

9. The ADC calibration system of claim 8, wherein the clock generating circuit comprises:
an operation flip-flop group, comprising multiple flip-flops sequentially coupled in a series connection, and configured to generate the multiple operation clocks according to the system clock; and
multiple phase-adjusting units, correspondingly coupled with positive output nodes of the multiple flip-flops of the operation flip-flop group, and configured to adjust phases of the multiple operation clocks;
wherein a first phase-adjusting unit of the multiple phase-adjusting units couples with the first ADC, and when the first phase-adjusting unit receives the time skew calibration signal, the first phase-adjusting unit adjusts the phase of the first operation clock according to the time skew calibration signal.

10. The ADC calibration system of claim 9, wherein the clock generating circuit further comprises:
a standard flip-flop group, comprising multiple flip-flops sequentially coupled in a series connection, and configured to generate multiple standard clocks according to the system clock, wherein phases of the multiple standard clocks are corresponding to the phases of the multiple operation clocks; and
a standard multiplexer, configured to output the calibration clock, wherein multiple input nodes of the standard multiplexer correspondingly couple with the multiple positive output nodes of the multiple flip-flops of the standard flip-flop group, and the standard multiplexer make the phase of the calibration clock to be corresponding to a phase of one of the multiple standard clocks according to the selection signal.

11. The ADC calibration system of claim 9, wherein the first phase-adjusting unit comprises:
multiple buffers, configured to delay the phase of the first operation clock, wherein the multiple buffers are sequentially coupled in a series connection; and
a phase-adjusting multiplexer, wherein an output node of each of the multiple buffers couples with one of multiple input nodes of the phase-adjusting multiplexer, and the phase-adjusting multiplexer is configured to selectively output the first operation clock delayed by one or more of the multiple buffers according to the time skew calibration signal.

12. An ADC calibration system, comprising:
a clock generating circuit, configured to generate an operation clock and a calibration clock according to a system clock, wherein a phase of the operation clock is the same as a phase of the calibration clock;
an under test ADC, configured to sample an input signal according to the operation clock to output an under test sampling result;
a standard ADC, configured to sample the input signal according to the calibration clock to output a standard sampling result; and
a calibration circuit, configured to compare the standard sampling result with the under test sampling result to generate a calibration information corresponding to the under test sampling result, and calibrate the under test sampling result according to the calibration information to make the calibrated under test sampling result approach to the standard sampling result.

* * * * *